US012776438B2

(12) United States Patent
Yen et al.

(10) Patent No.: US 12,776,438 B2
(45) Date of Patent: Oct. 27, 2026

(54) METAL MODULE FOR TRANSFORMER AND MANUFACTURING METHOD THEREOF

(71) Applicant: Delta Electronics, Inc., Taoyuan City (TW)

(72) Inventors: Chun-Ching Yen, Taoyuan City (TW); Yue Tsao, Taoyuan City (TW); Huai-Pei Tung, Taoyuan City (TW); Bor-Lin Lee, Taoyuan City (TW); Shaodong Zhang, Taoyuan City (TW)

(73) Assignee: Delta Electronics, Inc., Taoyuan City (TW)

( * ) Notice: Subject to any disclaimer, the term of this patent is extended or adjusted under 35 U.S.C. 154(b) by 968 days.

(21) Appl. No.: 17/951,829

(22) Filed: Sep. 23, 2022

(65) Prior Publication Data

US 2023/0326664 A1 Oct. 12, 2023

Related U.S. Application Data

(60) Provisional application No. 63/330,128, filed on Apr. 12, 2022.

(30) Foreign Application Priority Data

Jun. 17, 2022 (CN) ......................... 202210684762.2

(51) Int. Cl.

*H01F 27/28* (2006.01)
*H01F 27/34* (2006.01)
*H05K 1/181* (2026.01)

(52) U.S. Cl.

CPC ......... *H01F 27/2847* (2013.01); *H01F 27/34* (2013.01); *H05K 1/181* (2013.01); *H05K 2201/1003* (2013.01)

(58) Field of Classification Search

CPC ..... H01F 27/2847; H01F 27/34; H05K 1/181; H05K 2201/1003; H05K 1/0216; H05K 1/18; H05K 2201/10371

USPC .................................. 336/196, 198, 221, 83

See application file for complete search history.

(56) References Cited

U.S. PATENT DOCUMENTS

| | | | | |
|---|---|---|---|---|
| 2005/0112441 | A1 | 5/2005 | Iino et al. | |
| 2018/0205323 | A1* | 7/2018 | Cai | H01F 27/29 |
| 2019/0320554 | A1* | 10/2019 | Nakajima | H05K 1/165 |
| 2021/0076540 | A1* | 3/2021 | Zhang | H01F 27/2804 |
| 2021/0274656 | A1* | 9/2021 | Xiong | H05K 1/181 |

FOREIGN PATENT DOCUMENTS

| | | | |
|---|---|---|---|
| CN | 107993814 | A | 5/2018 |
| CN | 215342269 | U | 12/2021 |
| CN | 114050037 | A | 2/2022 |
| TW | 200304470 | A | 10/2003 |
| TW | M621419 | U | 12/2021 |

* cited by examiner

*Primary Examiner* — Shawki S Ismail
*Assistant Examiner* — Kazi S Hossain
(74) *Attorney, Agent, or Firm* — KIRTON McCONKIE; Evan R. Witt

(57) ABSTRACT

The present disclosure provides a metal module including a first metal sheet and a second metal sheet. The first metal sheet is electrically connected to a primary winding of a transformer. The second metal sheet is electrically connected to a secondary winding of the transformer. There is a distance between the first metal sheet and the second metal sheet, and the metal module is disposed outside a magnetic core of the transformer.

8 Claims, 6 Drawing Sheets

10

METAL MODULE FOR TRANSFORMER AND MANUFACTURING METHOD THEREOF

CROSS-REFERENCE TO RELATED APPLICATION

This application claims the benefit of U.S. Provisional Application No. 63/330,128, filed on Apr. 12, 2022, entitled "INTERLAYER CAPACITANCE-METAL COMPENSATION METHOD". This application claims priority to China Patent Application No. 202210684762.2, filed on Jun. 17, 2022, the entire contents of which are incorporated herein by reference for all purposes.

FIELD OF THE INVENTION

The present disclosure relates to a metal module and a manufacturing method thereof, and more particularly to a metal module for a transformer and a manufacturing method thereof.

BACKGROUND OF THE INVENTION

With the development of high power density of power supply system, the distance between electronic elements is getting closer, resulting in stronger coupling phenomenon. In addition, due to the space limitation of the inductor, the amount of winding turns and the size of the magnetic core of the transformer cannot be increased. For the above reasons, the electromagnetic interference (EMI) cannot be eliminated or reduced.

In a transformer, the interlayer capacitance between windings is the channel that generates electromagnetic interference. Under the development of high power density, the interlayer capacitance of the transformer is difficult to control due to the difficulty of the manufacturing process, the material difference of windings or the control of the material tolerance. As a result, the interlayer capacitance of each manufactured transformer is different, and the electromagnetic interference cannot be eliminated or reduced.

Therefore, there is a need of providing a metal module for a transformer and a manufacturing method thereof to obviate the drawbacks encountered from the prior arts.

SUMMARY OF THE INVENTION

It is an object of the present disclosure to provide a metal module for a transformer and a manufacturing method thereof. The metal module has first and second metal sheets disposed apart from each other. The first and second metal sheets are electrically connected to the primary winding and the secondary winding of the transformer respectively, so as to offset a part of the interlayer capacitance of the transformer. In the present disclosure, the interlayer capacitance difference in the transformer is eliminated through the first and second metal sheets, thereby reducing the electromagnetic interference.

In accordance with an aspect of the present disclosure, there is provided a metal module. The metal module includes a first metal sheet and a second metal sheet. The first metal sheet is electrically connected to a primary winding of a transformer. The second metal sheet is electrically connected to a secondary winding of the transformer. There is a distance between the first metal sheet and the second metal sheet, and the metal module is disposed outside a magnetic core of the transformer.

In accordance with an aspect of the present disclosure, there is provided a manufacturing method of a metal module. The manufacturing method of a metal module including steps of: (a) providing a metal module including a first metal sheet and a second metal sheet; (b) immersing the first metal sheet at a distance with the second metal sheet in a liquid glue within a container provided; (c) curing the liquid glue into a dielectric layer after a curing time; and (d) electrically connecting the first metal sheet to a primary winding of the transformer, and electrically connecting the second metal sheet to a secondary winding of the transformer. The metal module is disposed outside a magnetic core of the transformer.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
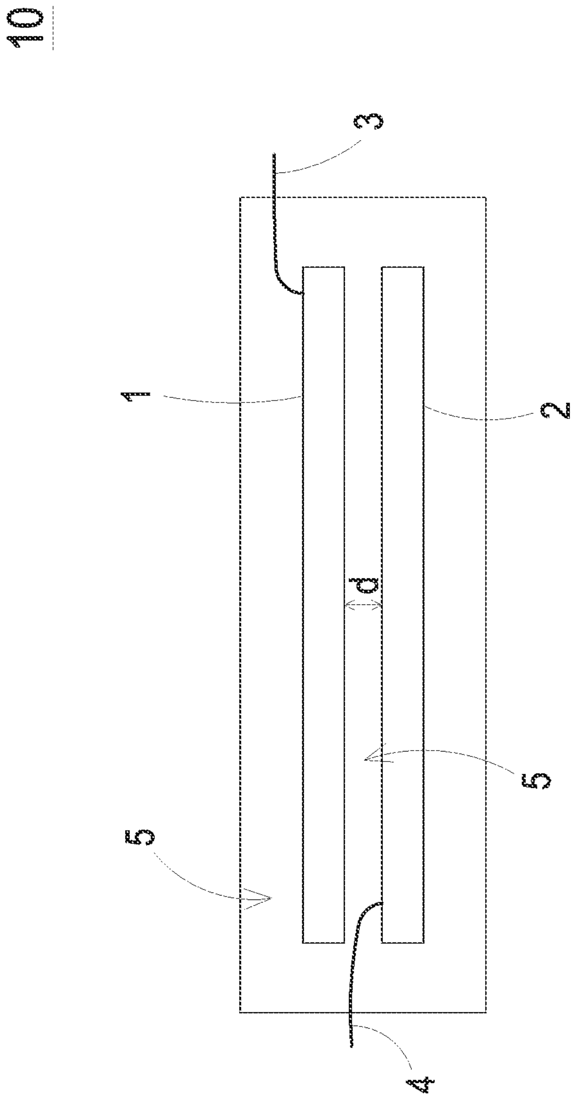
FIG. 1 is a schematic cross-sectional view illustrating a metal module according to an embodiment of the present disclosure.
Figure 2:
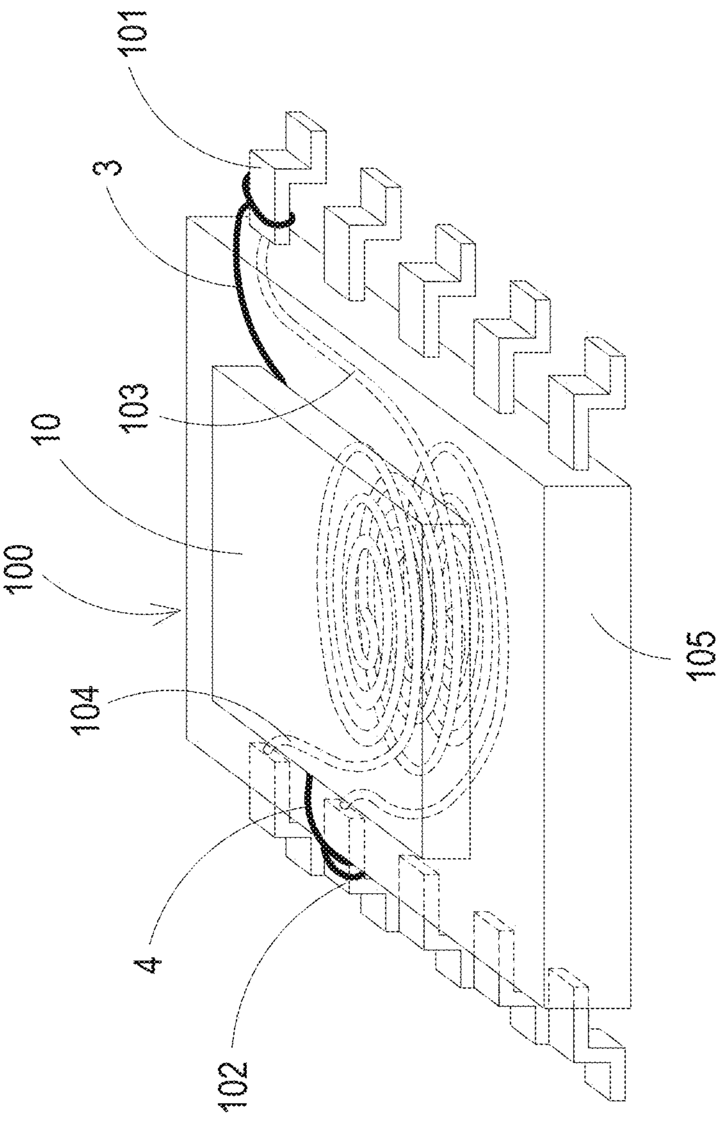
FIG. 2 is a schematic perspective view illustrating the metal module of FIG. 1 applied to a transformer.

FIG. 1 is a schematic cross-sectional view illustrating a metal module 10 according to an embodiment of the present disclosure. FIG. 2 is a schematic perspective view illustrating the metal module 10 of FIG. 1 applied to a transformer 100. As shown in FIGS. 1 and 2, the metal module 10 of the present disclosure includes a first metal sheet 1 and a second metal sheet 2. The first metal sheet 1 is electrically connected to the primary winding 103 of the transformer 100, and the second metal sheet is electrically connected to the secondary winding 104 of the transformer 100. There is a distance d between the first metal sheet 1 and the second metal sheet 2. The first metal sheet 1 and the second metal sheet 2 are for example but not limited to copper foil metal sheets. The metal module 10 is disposed outside a magnetic core 105 of the transformer 100 and is configured to offset a part of the interlayer capacitance of the transformer 100. The metal module 10 can be disposed on any side of the transformer 100 without limitation. In the present disclosure, the metal module 1 is disposed to offset the interlayer capacitance of the transformer 100, and the electromagnetic interference is reduced.

In an embodiment, the metal module 10 further includes a conductor 3 and a conductor 4 connected to the first metal sheet 1 and the second metal sheet 2 respectively. The primary winding 103 and the secondary winding 104 of the transformer 100 are connected to the outlet terminal 101 and the outlet terminal 102 respectively. The first metal sheet 1 of the metal module 10 is electrically connected to the primary winding 103 of the transformer 100 through the connected conductor 3 and outlet terminal 101, and the second metal sheet 2 of the metal module 10 is electrically connected to the secondary winding 104 of the transformer 100 through the connected conductor 4 and outlet terminal 102.

In an embodiment, the metal module 10 further includes a dielectric layer 5. The dielectric layer 5 is for example but not limited to a tape or a solid glue. The dielectric layer 5 covers the first metal sheet 1 and the second metal sheet 2, and a part of the dielectric layer 5 is disposed between the first metal sheet 1 and the second metal sheet 2. The dielectric layer 5 is configured to electrically insulate the first metal sheet 1 and the second metal sheet 2 from each other.

The size of the first metal sheet 1 and the second metal sheet 2 depends on the magnitude of the interlayer capacitance needed to be offset. For example, when the interlayer capacitance of the transformer 100 is relatively large, the size of the first metal sheet 1 or the second metal sheet 2 can be correspondingly increased to offset part of the interlayer capacitance of the transformer 100. Conversely, when the interlayer capacitance of the transformer 100 is relatively small, the size of the first metal sheet 1 or the second metal sheet 2 can be correspondingly reduced, and the size only needs to be large enough for offsetting the required part of interlayer capacitance.

Figure 3:
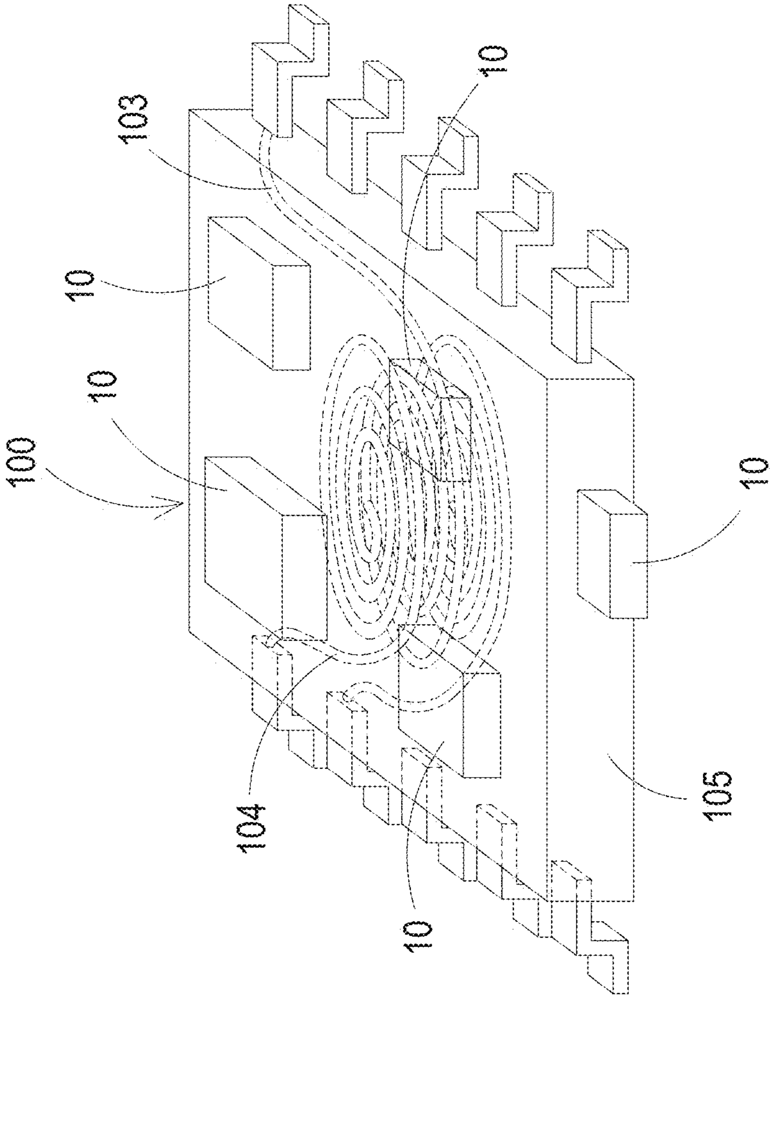
FIG. 3 is a schematic perspective view illustrating a plurality of metal modules applied to a transformer according to another embodiment of the present disclosure.

In addition, in an embodiment, the amount of the metal modules 10 may be increased to offset the required part of interlayer capacitance. Please refer to FIG. 3. FIG. 3 is a schematic perspective view illustrating a plurality of metal modules 10 applied to a transformer 100 according to another embodiment of the present disclosure. The elements of FIG. 3 that are similar with those of FIGS. 1 and 2 are represented by the same reference numerals, and the detailed description thereof is omitted herein. In this embodiment, a plurality of metal modules 10 are disposed outside the magnetic core 105 of the transformer 100 respectively. The first metal sheet and the second metal sheet of each metal module 10 are electrically connected to the primary winding 103 and the secondary winding 104 of the transformer 100 through the conductors respectively. It should be noted that the conductors connecting the metal modules 10 with the transformer 100 are not shown in FIG. 3 for making the figure concise.

Figure 4:
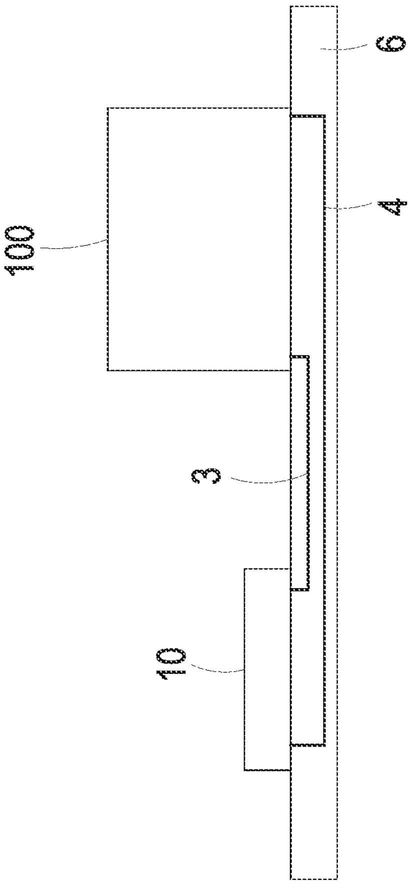
FIG. 4 is a schematic cross-sectional view illustrating the metal module applied to a transformer according to another embodiment of the present disclosure.

In addition, the metal module 10 is not limited to be disposed on any certain side of the transformer 100, the metal module 10 and the transformer 100 may be disposed on the same circuit board, and there is a distance between the metal module 10 and the transformer 100. Please refer to FIG. 4. FIG. 4 is a schematic cross-sectional view illustrating the metal module applied to a transformer according to another embodiment of the present disclosure. The elements of FIG. 4 that are similar with those of FIGS. 1 and 2 are represented by the same reference numerals, and the detailed description thereof is omitted herein. In this embodiment, the metal module 10 and the transformer 100 are disposed on the circuit board 6 with an interval therebetween. The first metal sheet and the second metal sheet of the metal module 10 are electrically connected to the primary winding and the secondary winding of the transformer 100 through the conductors 3 and 4. In this embodiment, the conductors 3 and 4 are the conductive pattern on the circuit board 6.

Figure 5:
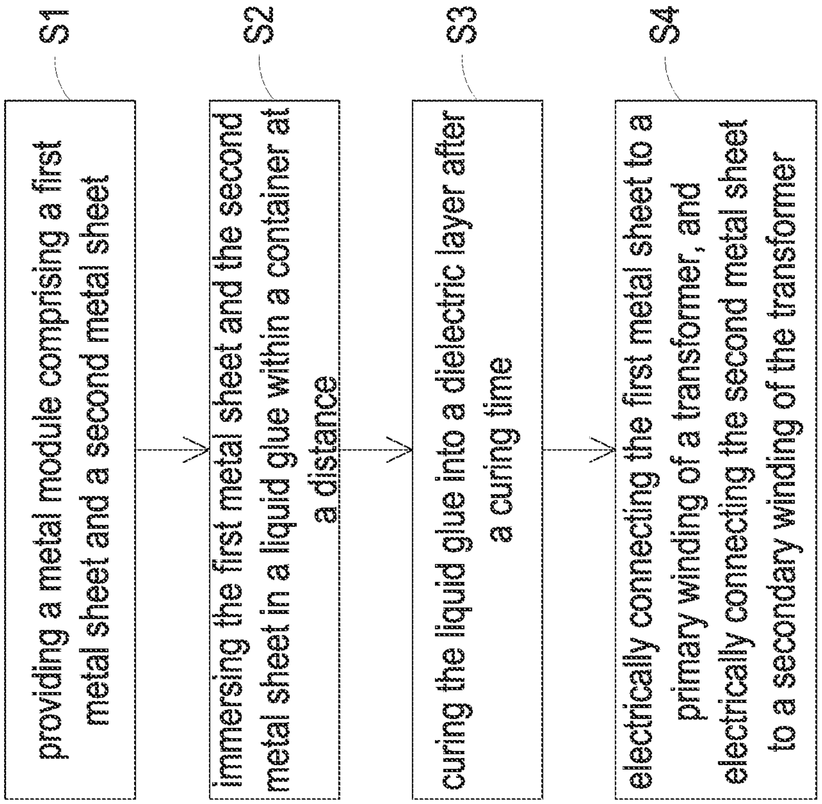
FIG. 5 is a schematic flow chart illustrating a manufacturing method of the metal module applied to a transformer according to an embodiment of the present disclosure.
Figure 6B:
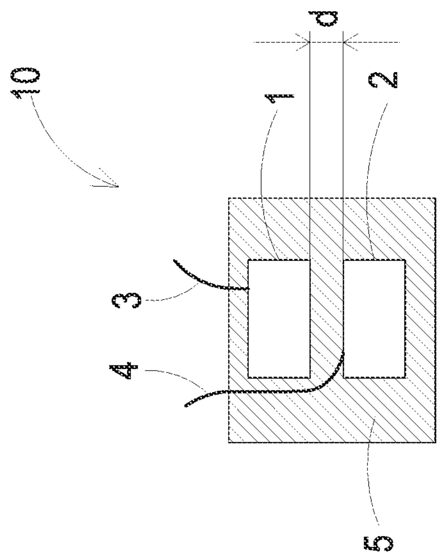
FIGS. 6A and 6B are schematic cross-sectional views illustrating the metal module corresponding to the manufacturing method of FIG. 5.
Figure 6A:
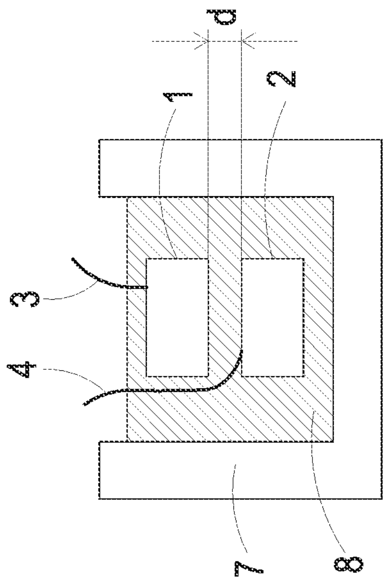

FIG. 5 is a schematic flow chart illustrating a manufacturing method of the metal module applied to a transformer according to an embodiment of the present disclosure. The manufacturing method of the metal module of the present disclosure is applicable for manufacturing the metal module 10 stated above. Please refer to FIG. 5 and corresponding FIGS. 6A and 6B, the manufacturing method of the metal module of the present disclosure includes steps S1, S2, S3 and S4. In the step S1, a metal module 10 including a first metal sheet 1 and a second metal sheet 2 is provided. In the step S2, as shown in FIGS. 5 and 6A, the first metal sheet 1 and the second metal sheet 2 are immersed in a liquid glue 8 within a container 7, and there is a distance between the first metal sheet 1 and the second metal sheet 2. In the step S3, after a period of curing time, the liquid glue 8 is cured into the dielectric layer 5, and the metal module 10 and the container 7 are separated from each other. The separated metal module 10 is shown in FIG. 6B. In the step S4, the first metal sheet 1 is electrically connected to the primary winding of the transformer 100, and the second metal sheet 2 is electrically connected to the secondary winding of the transformer 100. The metal module 10 is disposed outside the magnetic core of the transformer 100 and is configured to offset a part of the interlayer capacitance of the transformer 100.

From the above descriptions, the present disclosure provides a metal module for a transformer and a manufacturing method thereof. The metal module has a first and a second metal sheets disposed apart from each other. The first and second metal sheets are electrically connected to the primary winding and the secondary winding of the transformer respectively, so as to offset a part of the interlayer capacitance of the transformer. In the present disclosure, the interlayer capacitance difference of the transformer is eliminated through the first and second metal sheets, thereby reducing electromagnetic interference.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A metal module applied to a transformer, wherein the transformer comprises a primary winding, a second winding and a magnetic core, and the primary winding and the second winding are disposed inside the magnetic core, wherein the metal module is disposed outside the transformer and comprises:

a first metal sheet electrically connected to the primary winding of the transformer; and a second metal sheet electrically connected to the secondary winding of the transformer, wherein the first metal sheet and the second metal sheet are not wound around the magnetic core of the transformer and are not penetrated by the magnetic core, and the first metal sheet and the primary winding are different elements, and the second metal sheet and the secondary winding are different elements, and there is a distance between the first metal sheet and the second metal sheet, and the metal module is configured to offset a part of an interlayer capacitance of the transformer.

2. The metal module according to claim 1, further comprising a dielectric layer, wherein the dielectric layer covers the first metal sheet and the second metal sheet.

3. The metal module according to claim 2, wherein a part of the dielectric layer is disposed between the first metal sheet and the second metal sheet, and the part of the dielectric layer is configured to electrically insulate the first metal sheet and the second metal sheet from each other.

4. The metal module according to claim 3, wherein the dielectric layer is a tape or a solid glue.

5. The metal module according to claim 1, wherein the first metal sheet and the second metal sheet are copper foil metal sheets.

6. The metal module according to claim 1, wherein a size of the first metal sheet and the second metal sheet depends on a magnitude of the interlayer capacitance needed to be offset.

7. The metal module according to claim 1, comprising a plurality of metal modules, and the plurality of metal modules are disposed outside the magnetic core of the transformer respectively, the first metal sheet of each metal module is electrically connected to the primary winding of the transformer, and the second metal sheet of each metal module is electrically connected to the secondary winding of the transformer.

8. The metal module according to claim 1, wherein the metal module and the transformer are disposed on a circuit board, and there is an interval between the metal module and the transformer, the first metal sheet and the second metal sheet of the metal module are electrically connected to the primary winding and the secondary winding of the transformer through a conductor respectively.

* * * * *